United States Patent
Hindersson

[11] 3,949,373
[45] Apr. 6, 1976

[54] APPARATUS FOR FREQUENCY STUDIES EQUIPPED WITH IMPULSE GENERATOR AND STORAGE MEANS

[75] Inventor: Hans Hindersson, Taby, Sweden

[73] Assignee: System Frekvensor AB, Linkoping, Sweden

[22] Filed: Feb. 27, 1974

[21] Appl. No.: 446,328

[30] Foreign Application Priority Data
Mar. 12, 1973 Sweden .............................. 7303393

[52] U.S. Cl. ........................... 340/172.5; 324/78 D
[51] Int. Cl.² ......................................... G01R 23/02
[58] Field of Search ..... 340/172.5, 347 DD; 360/52; 324/77 B, 78 D

[56] References Cited
FOREIGN PATENTS OR APPLICATIONS
337,311    11/1971    Sweden ........................... 340/172.5

*Primary Examiner*—Vincent P. Canney
*Attorney, Agent, or Firm*—Hane, Baxley & Spiecens

[57] ABSTRACT

The present invention relates to an apparatus for carrying out frequency studies. A similar apparatus, which works satisfactorily, is disclosed in the Swedish Pat. No. 337,311. The operation of the apparatus in the patent relies on the punching of cards or tapes, which after perforation are collected for evaluation. This manual operation is, however, in certain cases timewasting and there is a present need for a superior method of indicating and storing information for subsequent evaluation.

12 Claims, 12 Drawing Figures

FIG. 8
TIME CHART
FOR PREFERRED FIXED POSITIONS OF TIME SELECTOR 12 OF IMPULSE GENERATOR 1
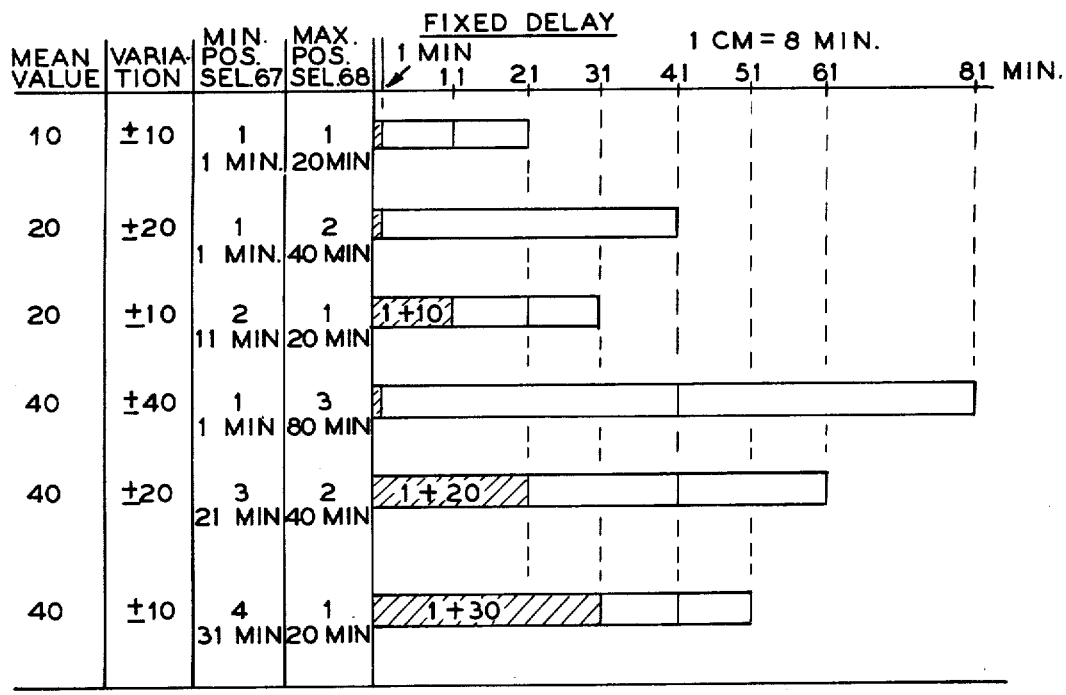
 RANGE OF DELAY
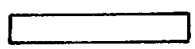 RANGE OF RANDOM SIGNAL

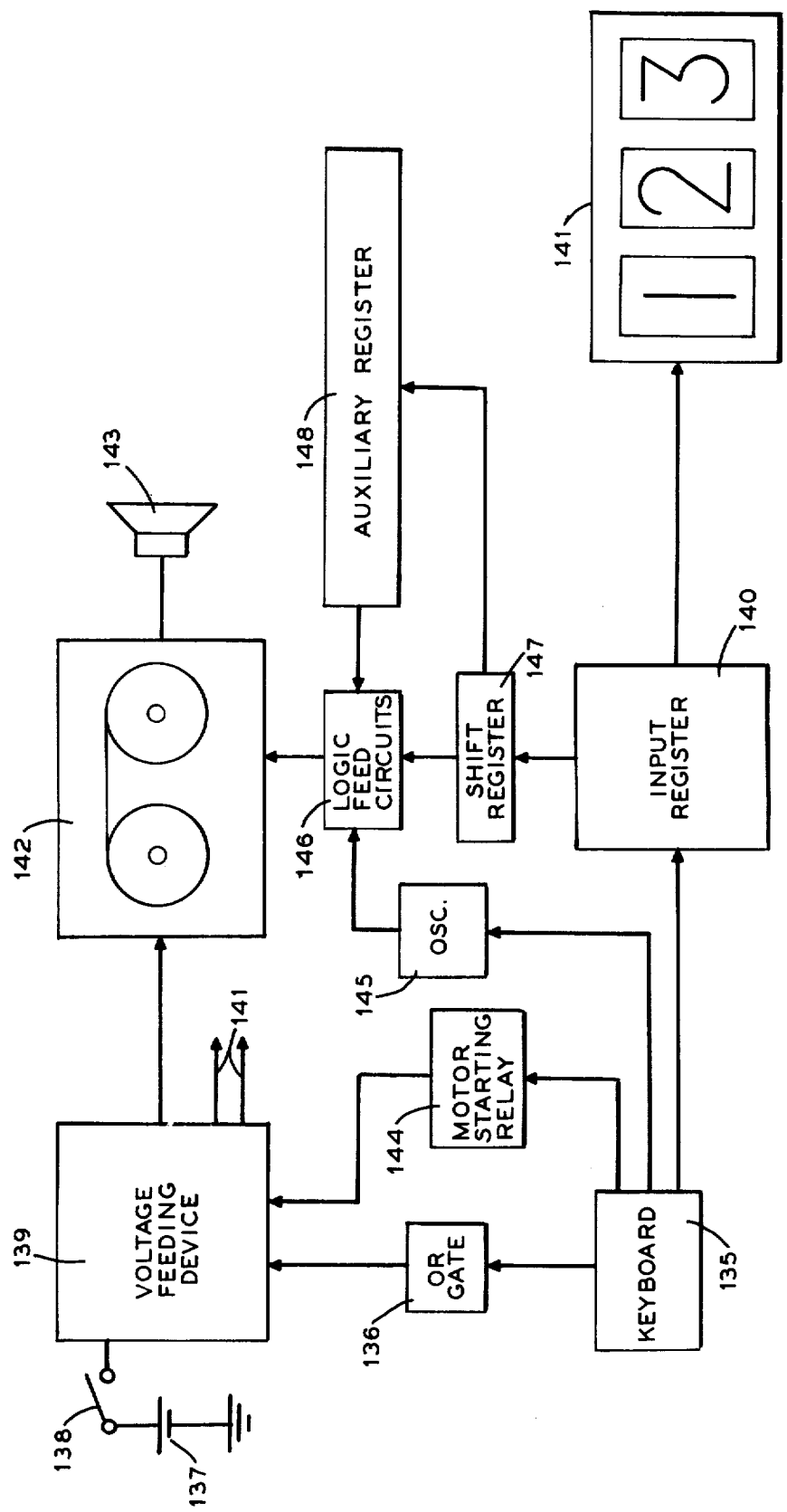

APPARATUS FOR FREQUENCY STUDIES EQUIPPED WITH IMPULSE GENERATOR AND STORAGE MEANS

An object of the present invention is to provide an apparatus, which is able to produce time impulses at random as well as predetermined times. The impulses, via signal generators, may be used for emitting acoustic- and/or light signals. In addition, the apparatus is further able to convert the signals in such a way, that they may be transferred to a storage means, which advantageously may consist of a digital incremental tape recorder. The apparatus in accordance with the present invention also contains a character generating device, operating in such a way that the generated signals are properly converted to enable transmission into said storage means or tape recorder.

The apparatus according to the invention further comprises a register with an indicating device or display, preferably housed jointly with the character generator, to register and indicate the information, which is to be stored, e.g. by the displaying of different members but which is also intended to indicate those instances when no response is returned on a given call-signal.

When the storage means according to the invention consists of a digital incremental tape recorder, possibly equipped with a so called "compact cassette", then the recorder is arranged to start up and reach a certain velocity prior to the transfer of characters. After the completion of character transfer the recorder is stopped again.

The apparatus disclosed by the present invention is equipped with a transfer device, the purpose of which is dual, on the one hand to interconnect the impulse generator unit, the character generator and the storage means with one another and on the other hand to enable external connections in such a way that random and clock impulses may be routed out of the apparatus and that incoming information may be received and stored. The transfer device has thus been equipped with blocking gates at the input in order to avoid interference with registrations in progress. The transfer device is further equipped with a binary coder and parallel-to-serial converter for the feeding of characters into the storage means, which is governed by a control member in the transfer device.

The transfer device is also provided with a counter for unanswered call-signals, the content of which is shown on the display.

The apparatus in accordance with the present invention includes firstly an impulse generator unit with signal generators, secondly a transfer device, thirdly a character generator with register and display, and finally a storage means.

All mentioned units constitute the apparatus according to the present invention, but it should be obvious, that each individual unit on its own may be used in other applications and are thus not restricted to this apparatus only.

The present invention will be more fully described in relation to the following nine drawings, where:

FIG. 8 shows a time diagram for random- and fixed call-signals intervals;

FIG. 11 shows the basic diagram of a recording device according to a second embodiment of the invention.

Figure 1:
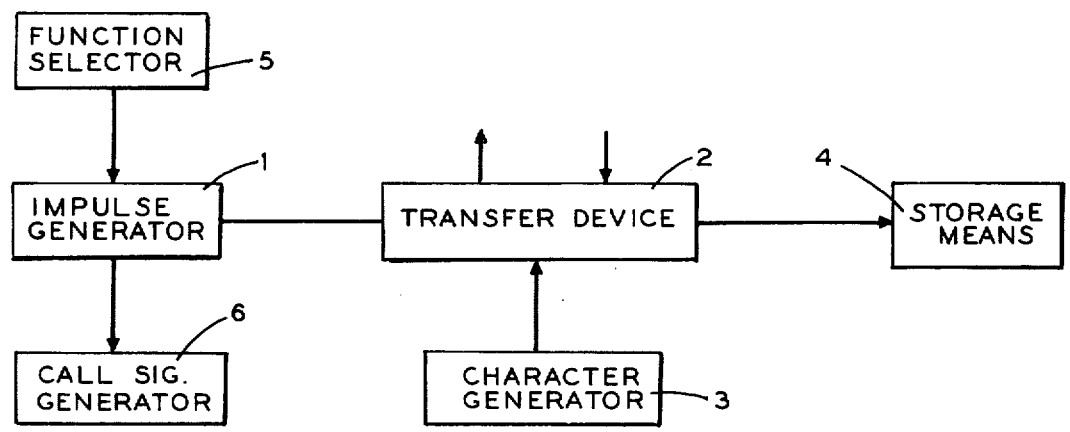
FIG. 1 shows a main block diagram of the apparatus according to the invention.

The Data Collector according to the first embodiment which will be described below in detail, consists of six main parts (see FIG. 1) namely: impulse generator unit 1, transfer device 2, character generator 3, storage means 4, function selector 5 and cell signal generator 6.

Figure 2:
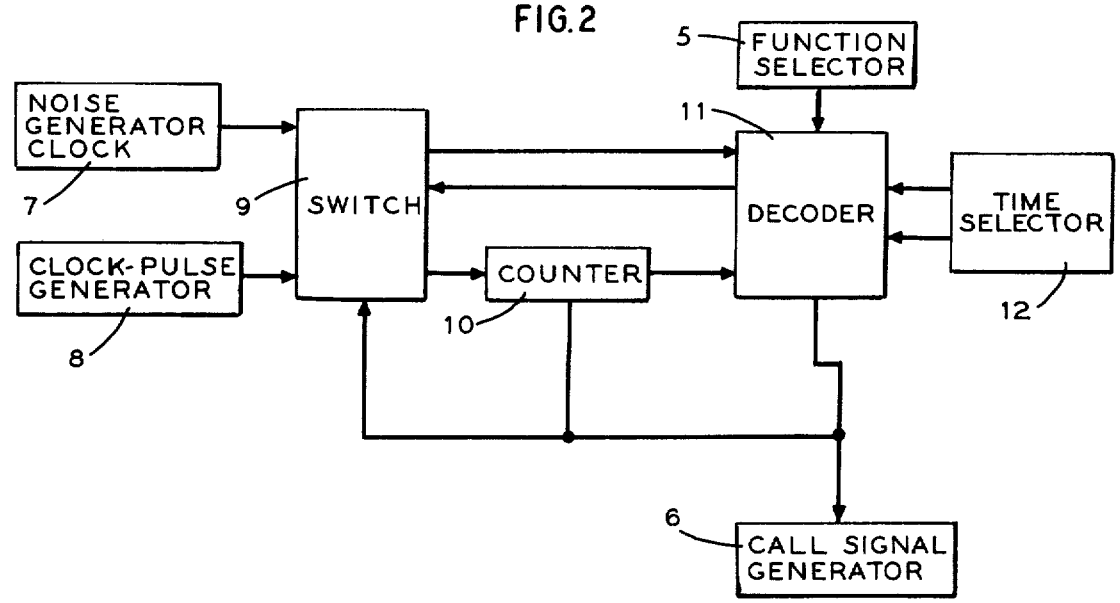
FIG. 2 shows a basic diagram of the impulse generator unit.

The impulse generator unit 1, shown in FIG. 2, uses as signal sources a noise pulse generator or noise generating clock 7 as well as a clock-pulse generator or clock 8. These signal sources are electronically switched in and out by means of an electronic switch 9 such that a counter 10, with a maximum capacity of 800, counts incoming pulses. By means of a time selector 12 a decoder 11 may be ordered to sense the contents of the counter 10 in a desired manner and to give an output signal to a call signal generator 6. The impulse generator unit is so designed as to always deliver the random impulses between a maximum- and a minimum time. These times may be adjusted with the time selector 12 and may e.g. be given values such as those indicated by the signal interval diagram in FIG. 8.

When starting, the impulse generator 1 is stepped forward by the clock-pulse generator 8 to the selected minimum time whereupon the electronic switch 9 disconnects the clock 8 from the counter 10 and alternatively connects the noise generating clock 7 for a certain short period of time, e.g. 1 second. On account of the high frequency (10 – 60 kHz) of the noise generating clock 7 the counter 10 will now complete a large number of full accumulations of 800 pulses and leave the counter containing a random number at the disconnection of the noise generating clock 7. The electronic switch 9 then reconnects the clock-pulse generator 8 which will then step the counter 10 forward to the selected maximum value whereupon a signal is released from the decoder 11 to the call-signal generator 6.

Figure 3:
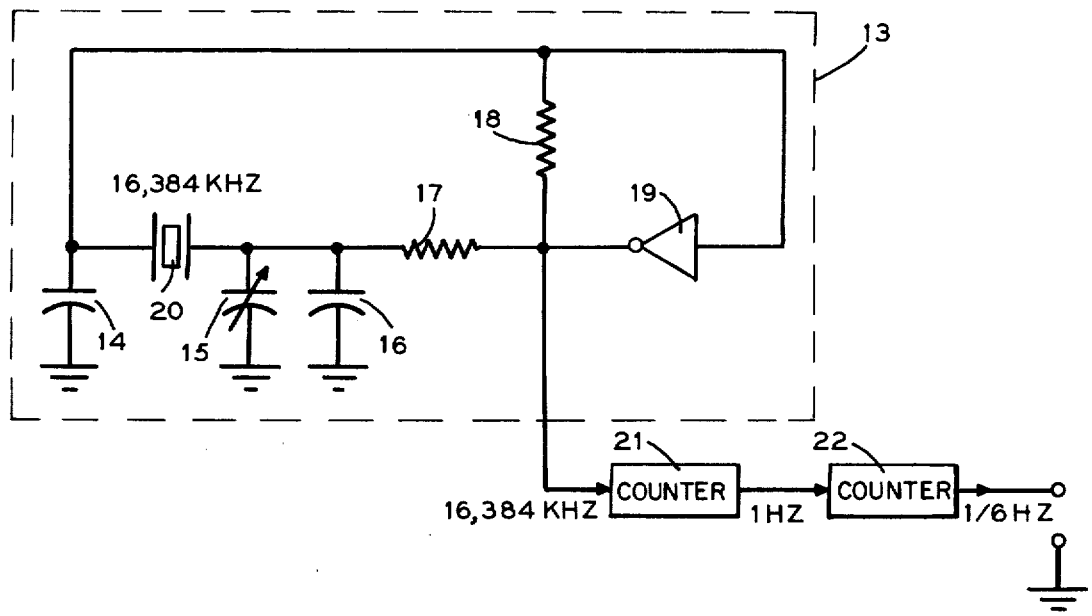
FIG. 3 shows a wiring diagram of a clock generator, which is part of FIG. 2.

The clock-pulse generator shown in FIG. 3 is incorporated in the impulse generator unit 8 and comprises three main parts, namely, the oscillator part 13 and two pulse counters 21 and 22. The first part is a crystal controlled oscillator 13 consisting of feedback amplifier 19 having a feed back resistor 18 and which is controlled by a crystal circuit. This circuit contains a crystal, ground to a resonant frequency of $2^{14}=16.384$ Hz and which is connected between capacitors 14–16, one of which is variable in order to adjust the output level of the oscillator. A resistor 17 is used to drive the crystal. The clock pulse generator 8 further consists of two binary adders 21 and 22, of which the first adder 21 is connected to the incoming train of pulses with a frequency of 16.384 pulses per second. The first counter 21 is a 14 stage binary counter, which is able to count up to $2^{14}$ e.g. 16,384. This will thus take exactly 1 second. Thus, the output signal to the second binary counter 22 will thereby have a frequency of 1 Hz. The binary counter 22 is a modulo-six counter and will thus deliver 1 pulse every 6 seconds to the counter 10 of the impulse generator unit 1.

Figure 4:
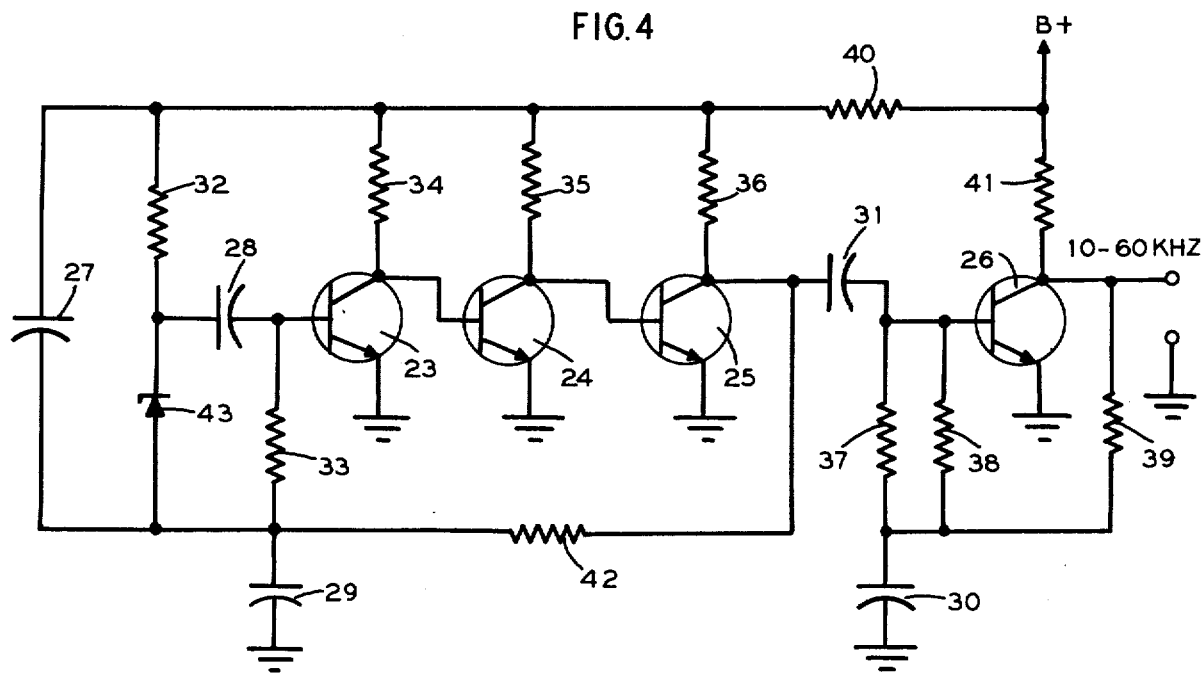
FIG. 4 shows a noise generating clock, which is part of FIG. 2.

The noise generating clock 7 is shown with its complete wiring diagram in FIG. 4. From a circuit, consisting of a capacitor 27, a resistor 22 and a Zends diode 43, noise signals are fed from the diode 43 via a coupling capacitor 28 to the input of a three stage amplifier comprising three transistors 23–25, which are DC-supplied by means of resistors 34–36 and 40 and which have a feedback path comprising resistors 42 and 33 as well as by capacitor 29. The amplified noise pulses need then be clipped or limited and are for that reason, via a coupling capacitor 31, fed to the base of a transistor 26, which is DC-supplied by collector resistor 41. The operating point of the transistor is adjusted by means of the resistors 37–38 as well as capacitor 30 and in such a way, that incoming pulses are clipped at a certain level maintained constant throughout the duration of the pulse, which may vary between 8– 50 ms. approximately.

Figure 5:
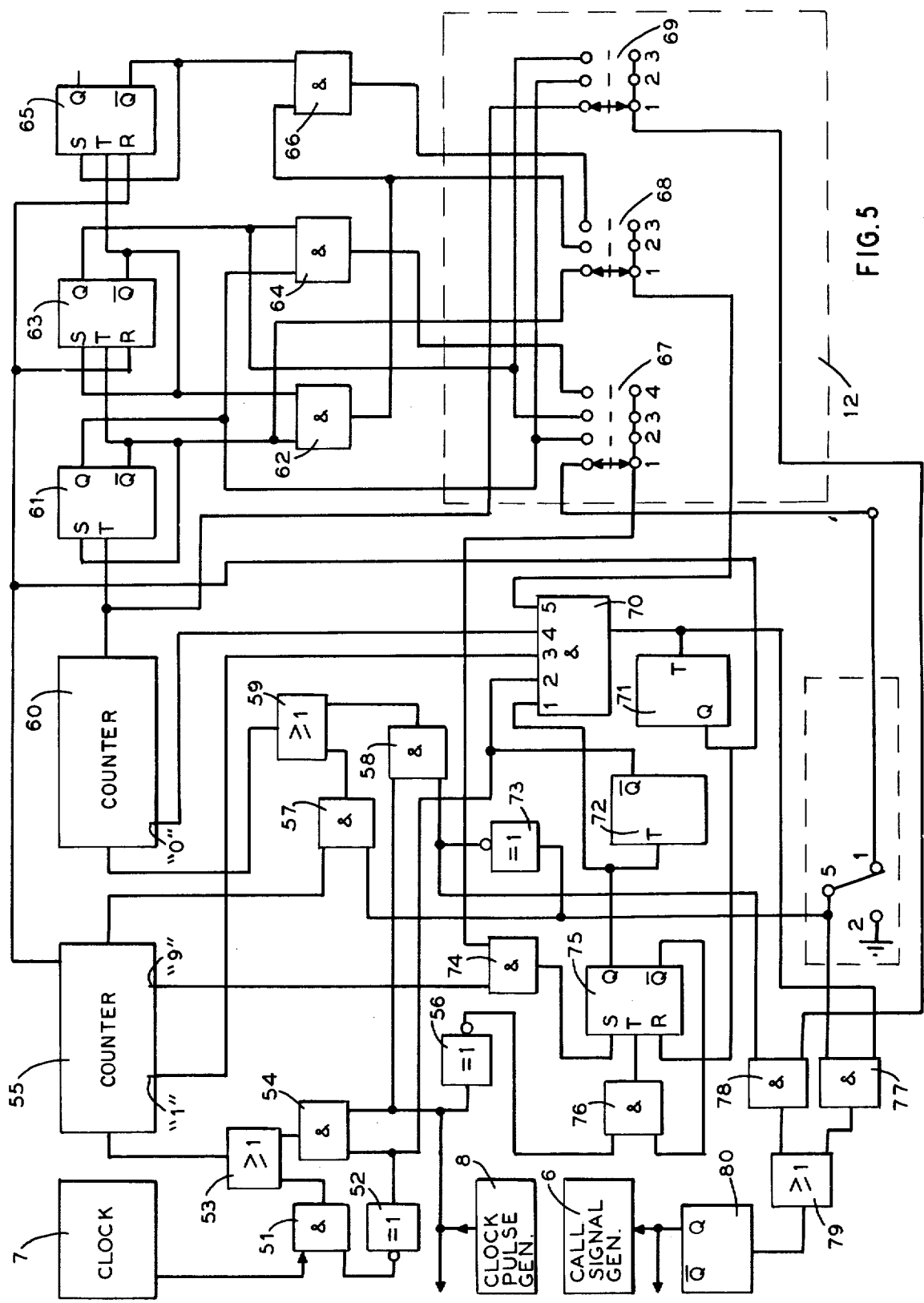
FIG. 5 shows a complete block diagram of the device in FIG 2.

The block diagram of the impulse generator unit 1 is shown in FIG. 5, where the five counters have been given the reference numbers 55, 60, 61, 63 and 65. The counters 55 and 60 are modulo-ten counters while the counters 61, 63 and 65 are flip-flops with two positions. The switch 9 consists of two and-gates 51 and 54, one or-gate 53 as well as one inverter 52. To connect the function selector 5 there are two and-gates 57 and 58, one or-gate 59 and one inverter 73 inserted between the two counters 55 and 60. The counter flip-flops 61, 63 and 65 are, via three and-gates 62, 64 and 66 connected to the switches 67–69 for the selection of desired time intervals in accordance with the examples given in the time-interval diagram shown in FIG. 8. The decoder 11 consists of an inverter 56, two and-gates 74 and 76, one bistable or counter flip-flop 75 and a monostable flip-flop 72 in connection with a decoder 70 for the decoding of maximum additional time. The output of the decoder 70 is wired to a signal decoder comprising two and-gates 77 and 78 as well as an or-gate 79, which in turn are connected to a monostable flip-flop 80 as signal output. The output of the max.-decoder 70 is also connected to a monostable flip-flop 71 intended for the resetting of the counters and the flip-flop 75.

The function selector 5 is usually in position 1 connecting the ingoing wire to the battery voltage +EB, to get a random signal when the inverter 73 puts zero-voltage on the input of the and-gate 78 to enable fixed interval signals from the counter to leave the signal output via selector switch 69 and the or-gate 79. The inverter 73 thus puts high voltage on one input of the and-gate 58 such that the A-counter 55 is disconnected and the clock 8 is directly connected to the B-counter 60. The fixed interval times, which may be selected by the three different positions of selector switch 69, are thus produced by the counters B, C and D, which now give 1, 2 and 4 min. respectively.

The timeselector 12 contains three selector switches 67, 68 and 69, as shown in FIG. 5. Delay-time or min. time may, by means of the selector 67, be chosen to 1, 11, 21 or 31 minutes. Maximum additional time during which the random signal is given, may be chosen within three different intervals namely 20, 40 and 80 minutes. Further a fixed time period of 1, 2 or 4 minutes may be chosen by means of selector 69 for use in the case when function selector 5 is turned to the position for fixed periods.

Reference is made to the time-diagram in FIG. 8, where the different selector settings are specified for getting the obtainable settings of the impulse generator unit as chosen in the diagram. It should be obvious that by modification of the counters, other delay times, mean values, variation and fixed time intervals easily may be achieved.

Figure 7:
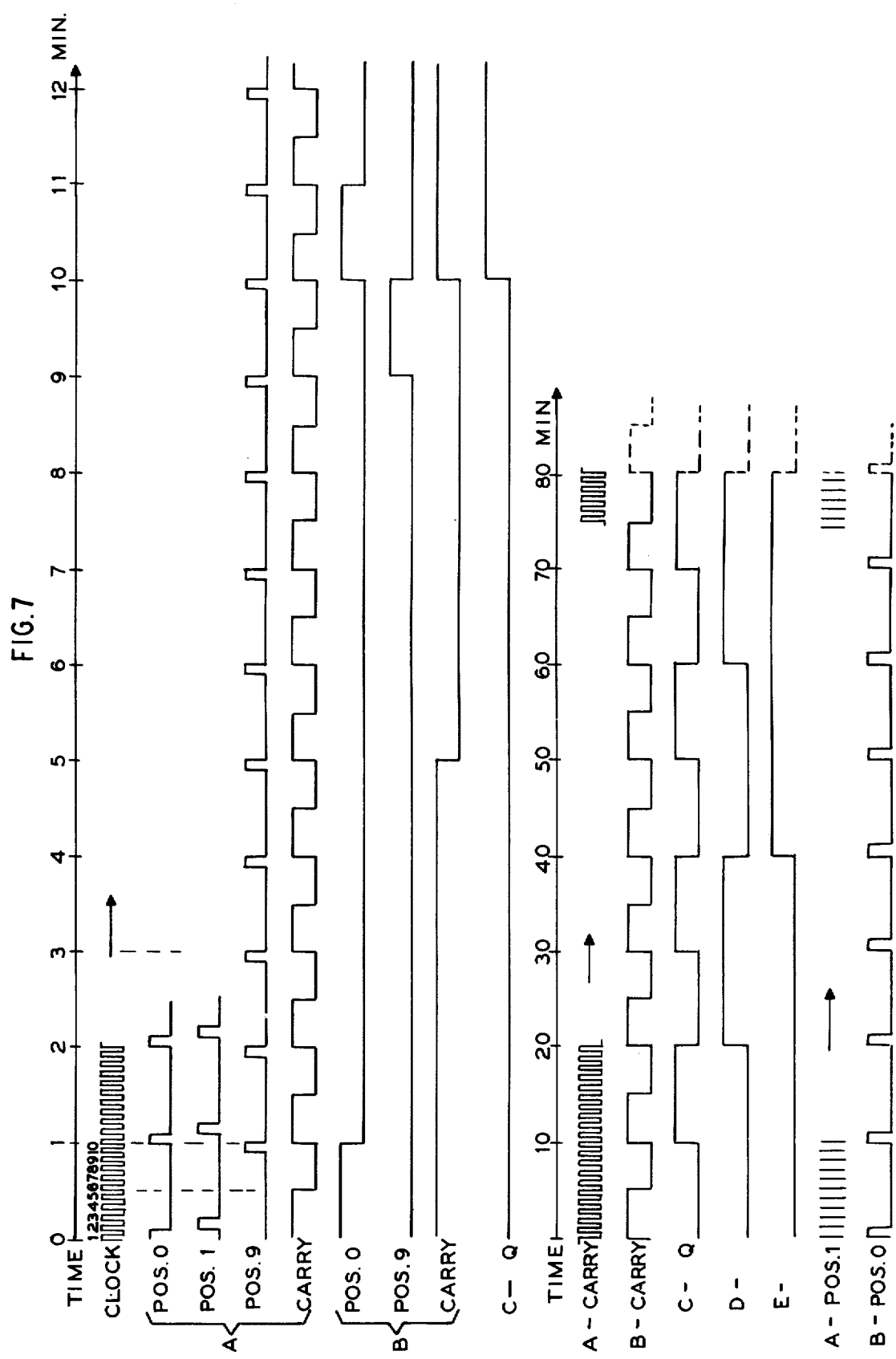
FIG. 7 shows a pulse-time diagram for the counting and flip-flop circuits of the impulse generator unit.

Initially, the function of the impulse generator unit 1 is going to be described by using the time-diagram of FIG. 7. We assume that clock 8 is coupled directly to the input of the A-counter 55 by keeping the flip-flops 75 and 72 in zero-position during the entire cycle 80 min., whereby the and-gate 54 is open to the clock 8 while the inverter 52 puts zero voltage on one of the inputs of the and-gate 51. Thus blocking the noise generating clock 7. Further it is assumed that the selector 68 is in position 3 for 80 min. additional time.

The clock 8 now, every 6 seconds from time zero, sends a pulse with a duration of 3 sec. to the A-counter 55, which, when receiving each pulse is stepping forward one step. When pulse no. 2 is received, position 1 is thus held, as shown in FIG. 7. Note that this position is part of the conditions for the signal-decoding at input no. 3 of the max.-decoder 70. The sequence is now repeated and at reception of pulse no. 6 the carry output steps down to zero level. When pulse no. 10 is received after 54 seconds, position 9 will be occupied, which position will open the gate 74, such that the selected min. time at switch 67 can affect the flip-flop 75, which is now assumed to remain at zero-level. When the eleventh pulse is received the A-counter 55 will flip to position 0 again but now with a carry signal at its output. On account of the selected position of the function selector switch, 5 the gate 57 is now open allowing the carry pulse to continue to the B-counter 61, which now leaves its zero-position and steps forward to its one-position. Note that said zero-position is part of the conditions for signal decoding at input no. 3 of the max. decoder 70.

The above described sequence is now repeated four times, so that at the total time of 5 minutes the B-counter switches to its position 5 and the carry-signal at the output is removed. The B-counter has thus stepped forward after 9 min. to its position 9 and after yet another sequence at 10 min. the B-counter 60 will return to its 0 position but with a renewed carry-signal at its output.

The outgoing carry-signal from the B-counter will then trigger the flip-flop 61, the output of which will now be high. This will thus occur at time 10 min. and the following sequence is now shown by the lower part of FIG. 7.

During the next 2 min. the above described sequence will be fully repeated and at time 20 min. the $\bar{Q}$-output of C-flip-flop 61 will return to zero-position. The Q-output of C-flip-flop 61 will now trigger D-flip-flop 63, the Q-output of which becomes high. The above repeated sequence is now repeated during the following 20 min., when the D-flip-flop returns to zero-position, such that its $\bar{Q}$-output will trigger the E-flip-flop 65 at time 40 min. Half of the counting sequence has now been described during which time a total of 400 clockpulses have been counted during 2400 sec. All of the described sequence is now repeated during the next 40 min., after which time the C, D and E flip-flops all are in zero-position. The counters have now reached their maximum capacity of 800 clock pulses counted during a time of 80 min.

A full operational cycle of the impulse generator unit 1 with random signal generation will now be described. In the interest of simplicity all function selectors are assumed to occupy the positions chosen in FIG. 5. At the starting point all counters are assumed to be in zero-position as a result of the max.-decoder 70 having triggered the flip-flop 71, whereby the flip-flop 75 will be in zero-position as well. As soon as the flip-flop 72 has high-voltage on its Q-output the gate 54 opens for the clock 8 and the gate 51 will be closed to the noise generating clock 7 by means of the inverter 52, which applies zero-voltage on one of the inputs of gate 51. This implies that those pulses, which every sixth sec. arrive at the second input of gate 54, now are able to reach the A-counter 55 via the or-gate 53. The operational cycle of the signal generating unit 1 has now been started in the same manner as described above and we now find ourselves at time 0 according to the time chart in FIG. 7. After 6 sec. the A-counter 55 steps forward to position 1 and a signal is initiated to input 3 of the max.-decoder 70, but nothing will happen because other inputs are at zero, and the condition for an output signal is that all inputs must be simultaneously high. When 54 sec. have elapsed the A-counter switches to position 9 opening gate 74 because the other input is also high via selector 67 and battery EB, thus prepairing the flip-flop 75 for switching. When the 10th clock-pulse ceases at time 57 sec. the output of inverter 56 reverts to high-position and the gate 76 gets high-signal at both its inputs since the flip-flop 75 is still in its low-position and its Q̄-output still high. The output of and-gate 76 now changes to high and the flip-flop 75, which is prepaired for switching, will now change to the one-position.

The changing of flip-flop 72 will now trigger the monostable flip-flop 72, which has the feature of remaining only 1–2 sec. in its high-position and than returning to its zero-position. During this time the Q̄-output of flip-flop 72 will be low thus blocking the gate 54 and clock 8 from the A-counter, while the inverter 52 opens the gate 51, which will then open up for the train of rapid pulses (freq. 10–60 kHz) of the noise generating clock 7. By virtue of the now low Q̄-output of flip-flop 72, the max. decoder 70 is blocked during this rapid sequence, when the counters will count to 800 pulses a great number of times during the 1–2 sec., which elapse before the flip-flop 72 returns to its zero-position. This implies that the noise generating clock 7 will be removed again by the inverter 52 and the gate 51 and that the clock 8 is reconnected via the gate 54 and also that the counters find themselves in a purely random position, when the clock 8 resumes the stepping forward of the adders towards their selected max.- number, which in FIG. 5 is chosen to 20 min. or a total sum of 200 pulses. When the counters in due time have stepped forward to the selected number (200) the flip-flop 61 gets a high Q̄-output, which by route of selector 68 gives high-level on the input no. 5 of the max. decoder 70. Input no. 4 is now high since the B-counter lies in position 0 and further inputs no. 1 and no. 2 are also high because flip-flop 75 is in high-position and flip-flop 72 in zero-position. At the next clock-pulse the A-counter 55 steps over to position 1 causing input no. 3 to be high as well. The max. decoder 70 will now deliver a call signal, which via the and-gate 77 and the or-gate 79 triggers the flip-flop 80 causing light- and audio-signals to attract attention. The call-signal generator 6 is provided with a breaker for manual switch-off as well as a built in device for automatic switch-off in case the Data Collector has been left unattended.

Impulses are also delivered to the transfer device 2 for counting and then relayed to the display-unit 46 where a digit display is lit. The output signal of the max. decoder 70 also triggers the flip-flop 71, which resets the counters as well as the flip-flop 75. When resetting the counters, they will start counting new pulses from the clock 8 and a new cycle of operation will commence immediately.

Briefly described the impulse-generator unit 1 is arranged to generate a random signal within a preselected time-interval after a fixed and a selected delay-period. These random signals may by means of a selector 5 be converted to signals with fixed periodicity, which may be selected with selector 69. In addition, the impulse generator unit 1 generates clock pulses, which are directly delivered by the clock pulse generator 8.

By a simple modification of the impulse generator unit all the outputs of the counters may be fed through suitable blocking gates and connected to the display unit 46 in such a way, that the random number, at which the counters have stopped after being fed from the noise generating clock 7, may be visible on the display unit 46.

Figure 6:
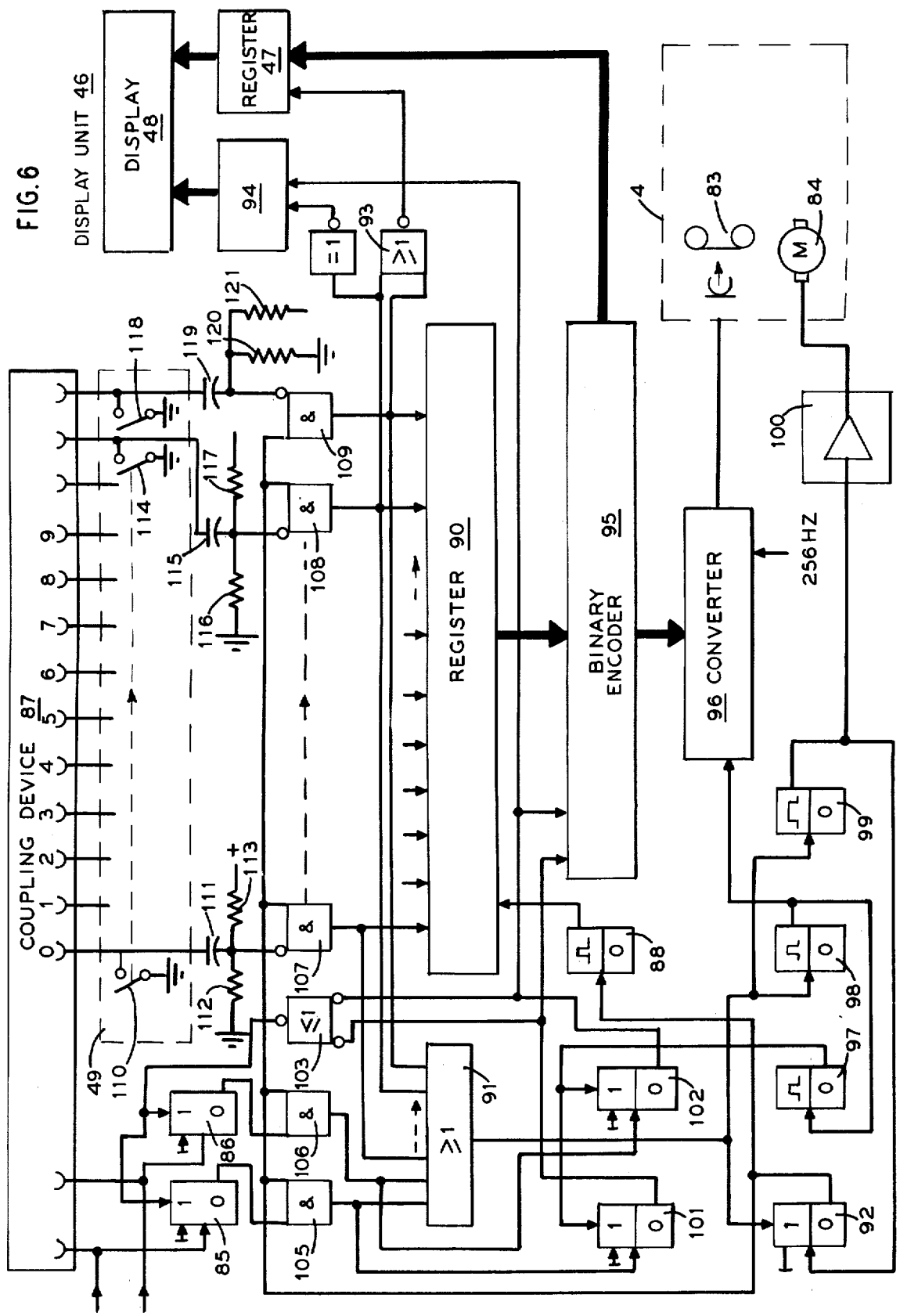
FIG. 6 shows a basic diagram of the transfer device.
Figure 9:
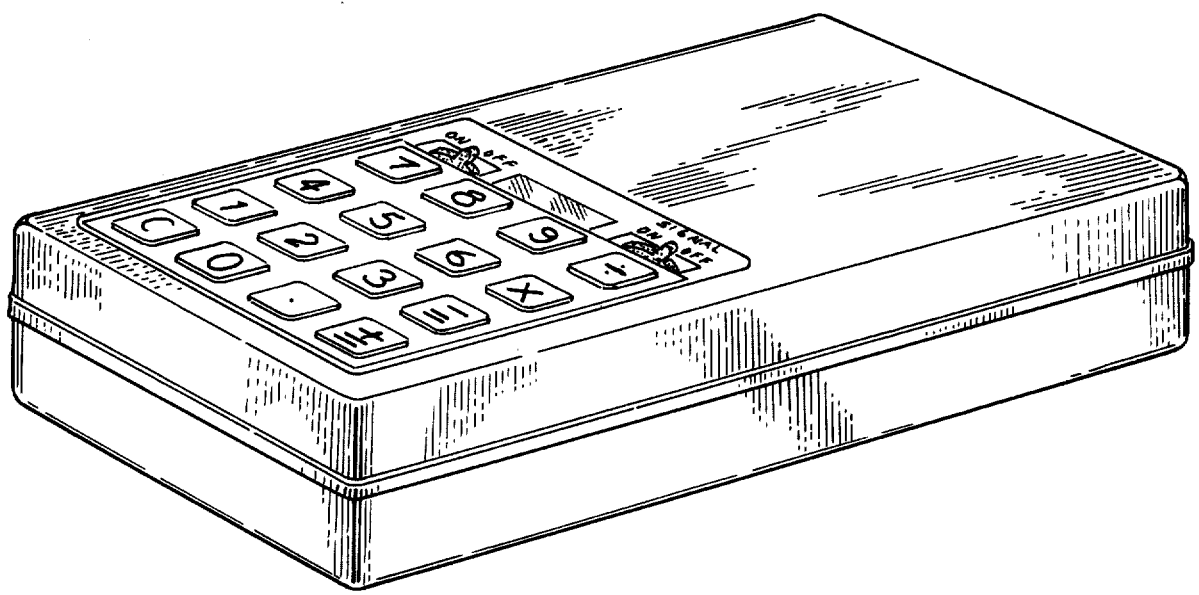
FIG. 9 shows the entire apparatus mounted in its housing.

The character generator 3, which is shown in FIG. 6, is preferably integrated with the display unit 46, which also comprises a register 47 and a display device 48. The character generator 3 contains a keyboard 49, which is provided with at least 13 characters (10 digits, comma, skip and enter) and which has facilities for the connection of the contacts of the keyboard 49 to a transfer device 2 and to a binary coder 95 located in said transfer device 2. As shown in FIG. 9 the character generator 3 and the display device 48 may preferably be jointly located in the upper side of the housing. The purpose of the storage means 4 is on the one hand to store data regarding continuous time- and random signals on the other hand to store that information, which via the keyboard 49 or from outside, is fed into the transfer unit 2. The storage means 4 may for example consist of a digital incremental tape recorder of the compact cassette-type comprising a recording unit 83 and a drive motor 84. The recording unit 83 is fed from a parallel-to-serial converter 96 present in the transfer unit 2 and the motor 84 is controlled by a control flip-flop 99 with associated amplifier 100, which is also located to the transfer unit 2. When the type-cassette, preferably of model C 120 type, is fully recorded it may swiftly be sent for automatic evaluation, while the Data Collector is provided with a fresh cassette.

The transfer unit 2 functions as a connector device for the character generator 3 with the desplay unit 46 and allows as such also external connection for the output of signals and the input of characters by means of a coupling device 87. Further, the transfer unit 2 serves as coupling means between the impulse generator 1, the character generator 3, the display unit 46 and the storage means 4 in which capacity the transfer unit also serves as a coding- and control means. In order to fed information e.g. into the tape recorder, the unit 2 is provided with keyboard register 90, a binary coder 95 and a parallel-to-serial converter 96. A cut-off is now required to stop the input of further characters during the time required to record previous characters, for which reason blocking gates have been arranged on all incoming leads from the character generator 3. The transfer unit 2, which now will be described in detail, contains a device 87 for external connection and which is coupled to the keyboard 49 and its make-contacts (110, 114, 118, etc.). All of these 13 make-contacts (one for each character) are via their own zero-pulse generating circuit consisting of a capacitor (111, 115, 119, etc.) and two resistors (112, 116, 120, etc.) as well as (113, 117, 121, etc.), connected to one of the inputs on their own corresponding and-gate (107, 108, 109, etc.) with inverted inputs. The other inputs, which thus are not connected to the make-contacts of the character generator may now be connected to each other and used as a blocking-line, i.e. a zero-pulse will block all gates (105-109, etc.). The output of the blocking-gates (107-109, etc.) are then each and every one connected to a register 90 of the keyboard, which, inter alia, contains a registrating flip-flop for each character. The register 90, which has a special input for resetting coupled to a resetting flip-flop 88, is then connected to a binary encoder 95, which has inputs for the coding of time-pulses and random signals. The binary encoder 95 is further connected to yet another register 47 of the display unit 48 and to a parallel-to-serial converter 96, which has a control input "load" as well as an input for the required clock pulse $f_o$ with a frequency of e.g. $2^8 = 256$ Hz, obtained from the binary counter 21 of the impulse generator unit 1. The parallel-to-serial converter 96 is then connected with the storage means 4.

The incoming time- and random pulses from the impulse generator unit 1 are fed to the input of their own respective input flip-flop 85 and 86 respectively, the outputs of which are then connected to their own blocking gate 105 and 106, the outputs of which in turn are coupled to two flip-flops 101 and 102, which again in turn are connected to the binary coder 95 as well as to the resetting gate 103 for the resetting of the input flip-flop 85 and 86. The flip-flop 102 is also wired to the register 94 for unanswered calls.

The outputs of all blocking gates (105-109, etc.) are then connected to a decoder 91. The output of the decoder 91 is connected to a blocking flip-flop 92 as well as to two control flip-flops 98 and 99 of the monostable type, such that the control flip-flop 98 is coupled to the storage means 92. The output of the control flip-flop 92 is directly wired to said blocking line and to a monostable flip-flop 88, which is in turn connected to the reset input of the keyboard register 90.

The outputs of the blocking gates 108 and 109 are finally connected to an or-gate 93, the output of which after inversion is coupled to the display register 47. Further the output of the blocking gate 108 is connected to the register for unanswered calls 94 via the inverter 104.

The above described transfer unit 2 operates in such a way, that when a make-contact of the keyboard or the corresponding character from the outside temporarily grounds, one side of e.g. the capacitor 111, (corresponding to the character 0), then one of the inputs of blocking gate 107 will be high after inversion. Assume for the moment that the blocking line at the same time is high, then both inputs of the blocking flip-flop 107 are high causing a high out-pulse to be fed to the decoder 91, which only needs high level on one of its inputs in order to give a one-output. At the same time said high output-pulse is fed to the register 90 of the keyboard, where the character 0 is registered. The output of the decoder 91 thus becomes high which sets the blocking flip-flop 92, which now puts zero voltage on the blocking line thus closing all the blocking gates (105-109, etc.) with the result that no other character signals may enter into the keyboard register 90. When the output of the decoder goes high the monostable control flip-flops 98 and 99 receives a trigger pulse, whereby the flip-flop 99 starts the storage means 84 and the flip-flop 98 prepares the converter 96 for the transfer of the character, contained in the key-board register 90, via the binary coder 95 to the storage means 83. The flip-flops 98 and 99 are arranged in such a way that flip-flop 98 delivers a short pulse while flip-flop 99 delivers a considerably longer pulse. When the pulse from the flip-flop 98 ceases the parallel-series converter 96 carries out the feed in of the registered "zero-character" and due to the longer pulse of the flip-flop 99 the storage means 4 continues running during the time of the recording. When this is finished the flip-flop 99 returns to the zero position thus resetting also the bistable blocking flip-flop 92, which then re-opens the blocking line. At the same time the blocking flip-flop 92 sets the resetting flip-flop 88 resulting in a reset pulse being sent to the keyboard register 90.

The above sequence of events is then repeated during the recording of every character. When recording the character "enter" via and-gate 108 an additional zero-pulse is, via inverter 104, delivered to the register 94 for unanswered calls, which clears register 94. When recording the character "enter" as well as "skip" via and-gate 109 a zero pulse is delivered to the display register 47 via the or-gate 93.

At certain instances time pulses or time markings and random signals will arrive from the impulse generator unit 1. However, they cannot arrive simultaneously. At the arrival of a time pulse, this will set the flip-flop 85, which gives high level to one of the inputs of the blocking gate 105. Should at this time the blocking line be in the zero-position the gate 105 will block and nothing happens until the blocking line is reopened, when a one-pulse via the decoder 91 starts the above described redording sequence. At the same time said one-pulse proceeds to the bistable flip-flop 101 which is set, with the result that a zero-pulse is sent to the binary coder for recording as well as to the inverted input of the or-gate 103, the low level output of which will then reset the input flip-flop 85. When the flip-flop 98 delivers a short pulse to the parallel-to serial converter 96 the same pulse also goes to the flip-flop 97, which then gives zero-pulse out to reset the flip-flop 101.

At the arrival of a random signal exactly the same sequence will take place, but now, via the input flip-flop 86, blocking gate 106 and the flip-flop 102, which registers the random signal in the binary encoder 95 and which also registers the call in register 94 at the same time. The resetting sequence then occurs in an identical manner to that described above for the time markings, since these circuits are arranged in parallel.

Required battery- and power supply units are not shown in the diagrams. For mobile operation the life of the batteries will be strongly limited. For this reason the Data Collector should be equipped with a power-supply unit, which is able to take over the battery function via a plug in connector when the Data Collector is used in stationary operation.

In short, the method of operation of the Data Collector with random pulse generation may be described as follows: After application of power by means of a not shown on-off switch and desired time intervals have been selected on the inpulse generator unit 1 continuous clock pulses will every 6 seconds be recorded on the tape recorder 4, which preferably is provided with a new tape-cassette and where suitable characters or signs have been recorded for the start of the data collection. After a certain time a random signal or call signal will arrive from the impulse generator unit between two clock pulses, which call signal is presented by means of light-and audio signals. If the operator is present he will shut off the call signal generator 6, which is equipped with a special switch for this purpose. The operator will now see that the number 1 is on display. Possibly in a modified design the random number from the impulse generator unit counted by the counter can also be put on display. The operator will now register desired characters on the tape by means of the keyboard in accordance with a mutually agreed on code. As a result the counter for unanswered calls 47 will return to zero and the sequence is restarted. The operator is able, when pressing the keys of the keyboard, to see which characters are entered, but erroneous characters, cannot be erased and it has instead been necessary to provide the possibility of excluding characters, by introducing this in the program by means of the character "skip". Should the operator not be present the call will continue from the call signal generator 6 for a certain time but is then automaticly disconnected. At this time the number 1 is on display. In case a new call signal should come during the absence of the operator the entire sequence will be repeated with the difference that the digit 2 now is in display.

By means of an external connection 87 time pulses and random pulses may be sent to a different location where by means of e.g. an extra keyboard the call signal may be answered and the Data Collector thus remotely operated.

In the event that fixed time intervals are desired and these are selected by the function-selector 5 call-signals will arrive with constant intervals, and the answering is carried out in the same manner as described above.

Figure 10:
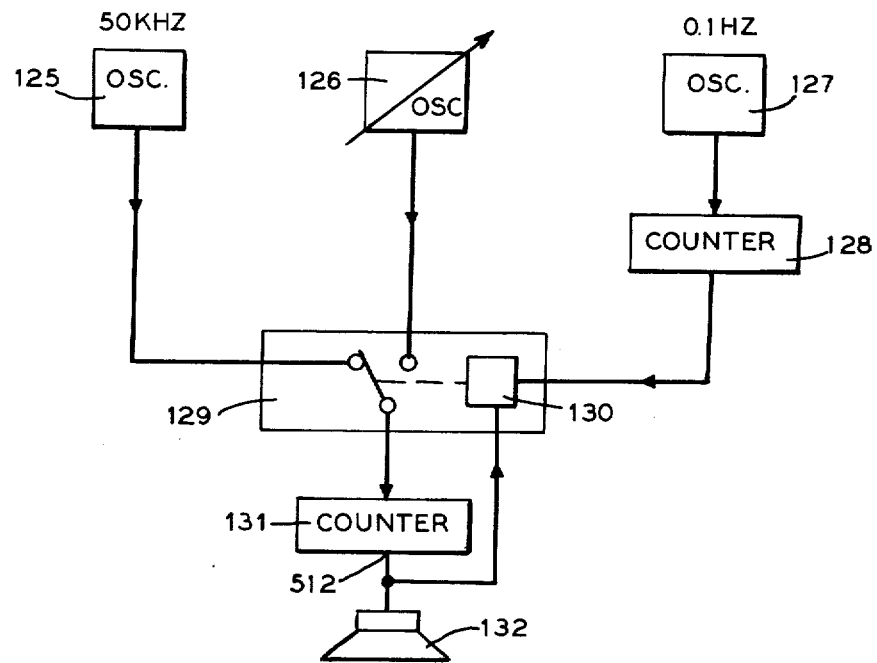
FIG. 10 shows the basic diagram of a random impulse generator according to a second preferred embodiment of the present invention.
Figure 12:
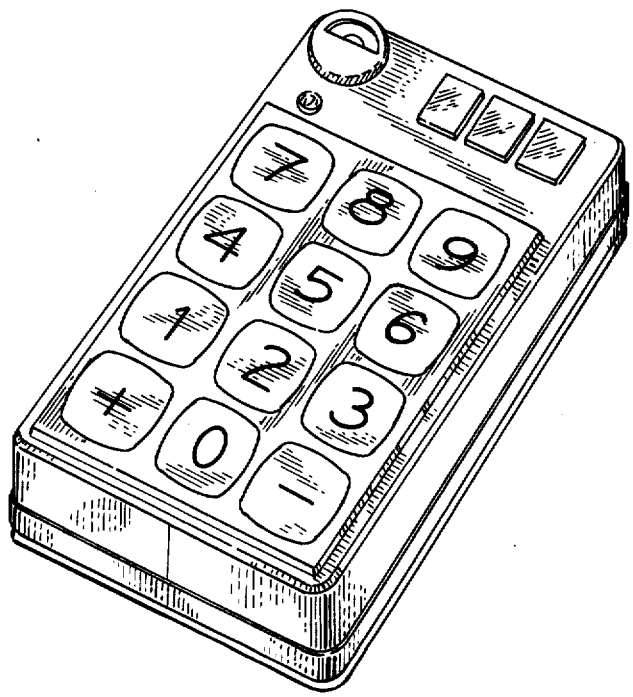
FIG. 12 shows the entire device of the second embodiment (model T2) mounted in its casing.

A second embodiment of the present invention is shown in FIGS. 10 and 11, where the random impulse generator according to FIG. 10 comprises: One oscillator 125 with high frequency (50kHz), a second oscillator with variable frequency 126 and a third oscillator 127 with low frequency (0,1 Hz). The three oscillators are herewith completely independent of one another.

The output of oscillator 126 with variable frequency is thus directly connected to an electronic switch 129, which also is directly connected to the output of oscillator 125. The switch 129 is triggered by a device 130, which decides when the output of switch 129 is coupled to oscillator 125 or oscillator 126. As shown in FIG. 10 the low frequency oscillator 127 is driving a counter 128, the output of which is controlling the switch 130.

The output of the switch 129 is further connected to a counter 131, e.g. a 512-counter, the output of which is connected to a call signal generator, e.g. an acoustic buzzer 132. Besides, the output of the counter 131 is connected to the triggering device 130 to interrupt the feeding of pulses from counter 128, when the counter 131 is full and a call signal has been given.

In order to produce random numbers and random time impulses with a fixed initial delay the impulse generator, as shown in FIG. 10, functions as follows: Initially the switch 129 is assumed to be in its left position such that the oscillator 125 is directly feeding the counter 131, which thus with great speed counts forward to 512, is reset and resumes counting 512, etc., which process is repeated approximately 100 times per second at an oscillator frequency of 50 kHz.

After a certain time a pulse from counter 128 is assumed to activate the trigger device 130 and thus the switch 129 which will stop the counter 131 at an arbitrary, random number between 0 and 512. This number may, if so desired, be fed to a display for direct reading. By matching properly the capacity of the counter 128 in relation to the frequency of the oscillator 127, required initial delay is obtained.

In this position the frequency of the variable oscillator 126 will be adjusted such that the desired range for random impulse generation is achieved by means of the counter 131, which will step or count forward towards its terminal position (512) with adjustable time between pulses as set on oscillator 126. When the counter 131 eventually reaches its end position (512) an impulse to the buzzer 132 is released and the trigger 130 activates the switch 129, such that the described sequence may be repeated.

Another preferred embodiment of the recording and storage means according to the present invention is shown in FIG. 11, where a voltage source 137 via a switch 138 will supply voltage to a voltage feeding device 139 which then supplies operating voltage to the rest of the circuits at desired times. A key-board 135 is via an or-gate 136 and a motor starting delay 144 connected to said voltage feeding device 139, which in turn is connected to a tape recorder 142 with an acoustic signal generator 143. The voltage feeding device 139 is further connected to the remaining logic circuits and to a light emitting diod display unit 141.

The key-board 135 is as shown in FIG. 11 further connected to an input register 140, the contents of which is shown on the display unit 141. The input register 140 is then coupled to a shift register 147 with associated auxiliary register 148, which in turn is coupled to the logic feeding circuits 146, which then is connected to the signal input of a tape recorder 142 and controlled by an oscillator 145, which in its turn is connected to the key-board 135.

The device, as shown in FIG. 11, for the recording of three characters works in the following manner: As soon as any one of the keys of the key-board are depressed a signal is passed to the voltage feeding device 139 via the or-gate 136, thus assuming that the switch 138 is on. The feeding device 139 will then deliver voltage to all logic circuits as well as to the display unit 141, which is then lit. The motor of the tape recorder will not start until later because of the motor starting delay 144, which will not activate the motor until all three characters have been entered on the key-board 135.

The first digit or character entered on the key-board is fed into the input register 140 and is immediately shown on the display at the same time as the digit is fed into the auxiliary register 148. When the second digit is entered it will in the same manner be shown in display via the input register 140 and the shift register 147 will shift the second digit in the auxiliary register 148. The third digit is then entered in the same manner such that three digits will now be on display and these same digits are now shifted into the auxiliary register 148 in series.

When the key of the key-board is released after the third entry a signal is given via the motor start delay 144 to start up the motor of the tape recorder 142 and at the same time an impulse is given to the oscillator 145 which starts. After a short time interval a signal is given to the character routing logic 146 to initiate the feeding in series of the first digit to the input of the tape recorder 142. When this is done a new pulse from the oscillator 145 and logic unit 146 will route the second digit into the recorder and finally the sequence is again repeated with the third and last character.

When all three digits have been fed into the recorder 142 the motor is stopped and all registers are reset and the voltage is disconnected by the voltage feeding device 139 such that all loads on the battery 137 will cease during "dead" periods with the aim of obtaining longest possible life of the battery.

While preferred examples and embodiments have been shown in illustrating the invention, it is to be clearly understood, that various changes in details and arrangements may be made without departing from the spirit and scope of the invention as defined in appended claimed subject matter.

I claim:

1. Apparatus for frequency studies comprising: impulse generating means generating impulse signals occurring at random times and impulse signals occurring at periodically recurring times; a call signal generator means connected to said impulse generating means for generating call signals in response to the impulse signals; a character generator means for generating characters in response to said call signal generaor means; a transfer means connected to said impulse generating means and said call signal generator means for converting received impulse signals to recording signals and converting received characters to coded combinations or recording signals; and storage means connected to said transfer means for storing the recording signals as reproducible indicia.

2. The apparatus of claim 1 wherein said impulse generating means comprises a clock pulse generator and a noise pulse generator, a pulse counter having an input and a plurality of outputs, function selecting means for selectively connecting said clock pulse generator and said noise generator to the input of said pulse counter, decoder means connected to the outputs of said pulse counter for emitting an impulse signal when said pulse counter counts a given number of pulses, and time selector means for controlling said decoder means to decode specific counts.

3. The apparatus of claim 2 wherein said time selector means includes first means controlling said decoder means to decode a count related to a selected delay time, second means controlling said decoder to decode a count related to the times a random impulse signal is to be generated after said delay time, and third means for determining the periodically recurring times that impulse signals are generated.

4. The apparatus of claim 1 wherein said storage means is a digital incremental tape recorder.

5. The apparatus of claim 1 wherein said storage means includes a solid state register.

6. The apparatus of claim 1 wherein said character generator means includes a multikey keyboard.

7. The apparatus of claim 1 wherein said transfer means has control means for alternately accepting said impulse signals or said characters and priority means for establishing which has priority of acceptance.

8. The apparatus of claim 1 wherein said transfer means includes means for converting the received characters to a combination of serially occurring recording signals.

9. The apparatus of claim 1 wherein said transfer means includes terminal means for accepting characters from an external source and for transmitting to the external source impulse signals.

10. The apparatus of claim 1 wherein said transfer means is connected to a character generator for visually displaying characters.

11. The apparatus of claim 1 wherein said character generator means includes means for displaying characters and means for indicating that a character was not entered after a call signal was generated.

12. The apparatus of claim 11 wherein said displaying means utilize electrically energizable light elements for displaying the number of call signals not responded to.

* * * * *